(12) United States Patent  
Yeung et al.

(10) Patent No.: US 8,779,598 B2  
(45) Date of Patent: Jul. 15, 2014

(54) METHOD AND APPARATUSES FOR INTEGRATED CIRCUIT SUBSTRATE MANUFACTURE

(75) Inventors: Fan Yeung, Irvine, CA (US); Raymond (Kwok Cheung) Tsang, Irvine, CA (US); Edward Law, Ladera Ranch, CA (US)

(73) Assignee: Broadcom Corporation, Irvine, CA (US)

( * ) Notice: Subject to any disclaimer, the term of this patent is extended or adjusted under 35 U.S.C. 154(b) by 180 days.

(21) Appl. No.: 13/170,820

(22) Filed: Jun. 28, 2011

(65) Prior Publication Data

US 2013/0001791 A1     Jan. 3, 2013

(51) Int. Cl.
*H01L 21/00*     (2006.01)
*H01L 21/30*     (2006.01)
*H01L 21/4763*     (2006.01)
*H01L 23/52*     (2006.01)

(52) U.S. Cl.
USPC ...... 257/773; 257/777; 257/778; 257/E23.03; 257/E23.087; 257/E21.575; 438/108; 438/109; 438/458; 438/622; 216/18; 216/20

(58) Field of Classification Search
USPC ............ 257/773, 777, 778, E23.03, E23.087, 257/E23.575; 438/108, 109, 458, 622; 216/18, 20

See application file for complete search history.

(56) References Cited

U.S. PATENT DOCUMENTS

| | | | |
|---|---|---|---|
| 5,691,245 A * | 11/1997 | Bakhit et al. | 216/20 |
| 7,443,026 B2 * | 10/2008 | Goldmann et al. | 257/727 |
| 2004/0074865 A1 * | 4/2004 | Ho et al. | 216/2 |
| 2007/0145367 A1 * | 6/2007 | Chen et al. | 257/49 |
| 2010/0044759 A1 * | 2/2010 | Bernstein et al. | 257/255 |
| 2010/0271777 A1 * | 10/2010 | Farrar | 361/690 |

* cited by examiner

*Primary Examiner* — Charles Garber
*Assistant Examiner* — Ron Pompey
(74) *Attorney, Agent, or Firm* — Sterne, Kessler, Goldstein & Fox P.L.L.C.

(57) ABSTRACT

Embodiments described herein provide a method of manufacturing integrated circuit (IC) devices. The method includes coupling a first surface of a first intermediate substrate to a first surface of a second intermediate substrate, forming a first plurality of patterned metal layers on a second surface of the first intermediate substrate to form a first substrate and a second plurality of patterned metal layers on a second surface of the second intermediate substrate to form a second substrate, and separating the first and second substrates. Each of the first substrate and the second substrate is configured to facilitate electrical interconnection between a respective IC die and a respective printed circuit board (PCB).

20 Claims, 8 Drawing Sheets

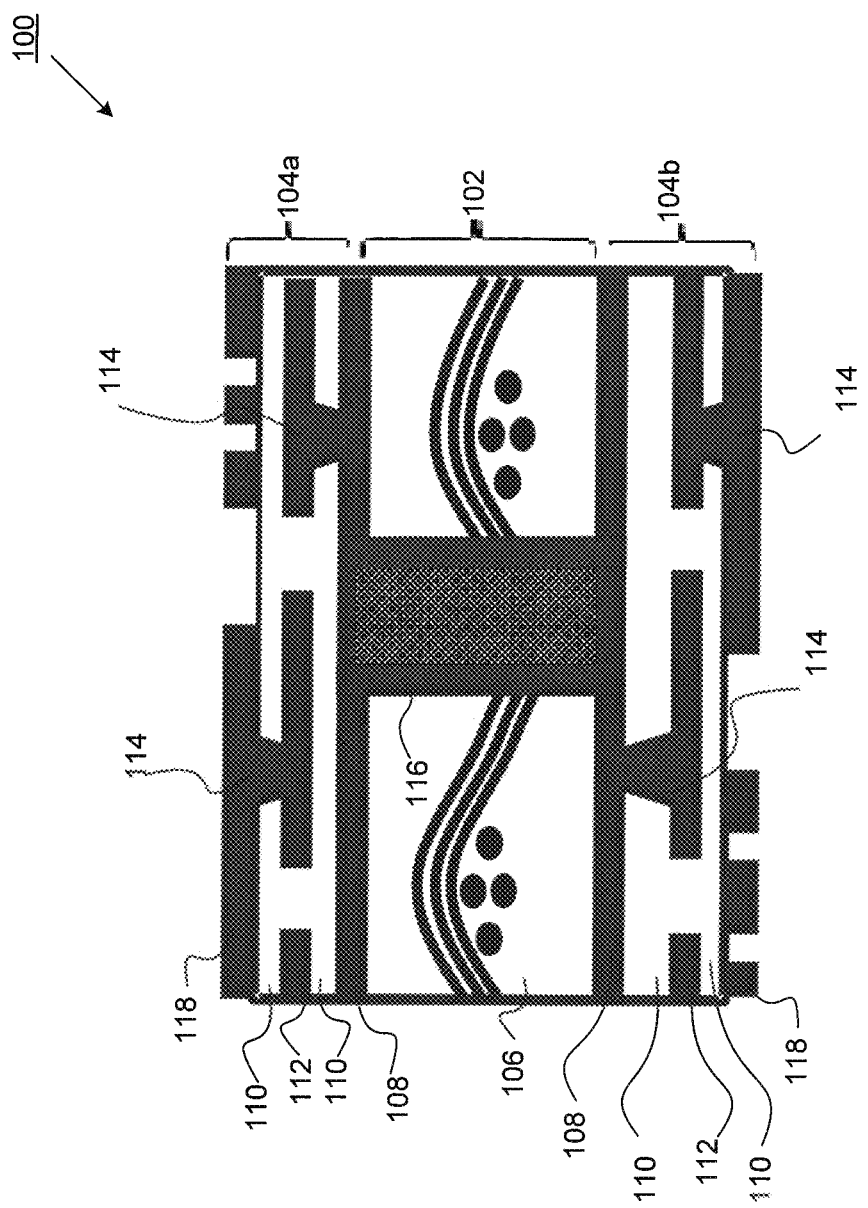
FIG. 1
Conventional

METHOD AND APPARATUSES FOR INTEGRATED CIRCUIT SUBSTRATE MANUFACTURE

BACKGROUND

1. Field

Embodiments described herein generally relate to methods and system regarding manufacture of substrates used in integrated circuit (IC) packaging.

2. Background Art

Integrated circuit (IC) devices typically include an IC die housed in an IC package. The IC package is used to protect the IC die from the surroundings and to facilitate electrical interconnection between the IC die and a printed circuit board (PCB) on to which the device is mounted. Through the PCB, the IC die can be electrically coupled to other IC devices mounted on the PCB.

IC packages typically include a substrate on which the IC die is mounted. The substrate is coupled to electrically conductive regions on the IC die (e.g., through wirebonds or solder bumps). The substrate can include multiple metal layers that are used to facilitate interconnection between the IC die and the PCB and with other IC dies located in the same device. The metal layers are separated by dielectric layers. Specifically, the substrate typically includes a relatively thick core dielectric in the center of the substrate on which the first pair of metal layers are formed and relatively thin dielectric layers that separate the remaining metal layers.

When signals are passed from one metal layer to another, e.g., using a via, the quality of signal degrades, with the amount of degradation being related to the thickness of the dielectric layer that separates the pair of metal layers. Because the core dielectric is relatively thick, signals that are especially sensitive to degradation often cannot be passed through the core dielectric. Thus, the metal layers formed on the side of the core dielectric opposite to the side on which an IC die is located are often wasted as they cannot be used to facilitate interconnections.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 1 shows a cross-sectional diagram of a conventional HDI/build up substrate.

FIG. 2 a flowchart providing example steps for manufacturing an IC device, according to an embodiment of the present invention.

Figure 2:
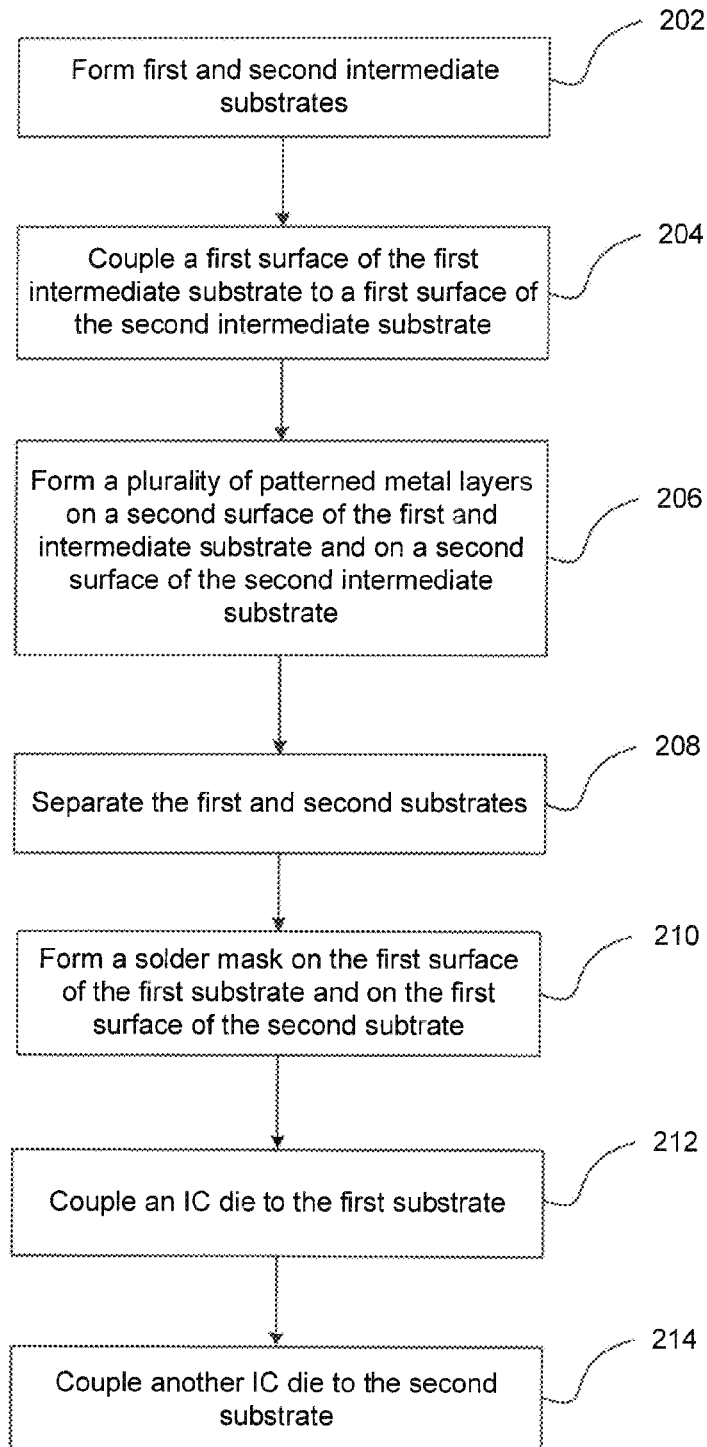

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Furthermore, it should be understood that spatial descriptions (e.g., "above", "below", "left," "right," "up", "down", "top", "bottom", etc.) used herein are for purposes of illustration only, and that practical implementations of the structures described herein can be spatially arranged in any orientation or manner.

FIG. 1 shows a cross-sectional diagram of a conventional HDI/build up integrated circuit (IC) substrate 100. Substrate 100 includes a core 102 and top and bottom outer layers 104a and 104b, respectively. Core 102 includes a dielectric core 106 and metal layers 108. Core dielectric 106 can be one of a variety of dielectric materials used for substrates known to those skilled in the relevant art. For example, core dielectric 106 can include any one of silicon dioxide, a polyimide, benzocyclobutane, a liquid crystal polymer, a fluoropolymer, or an epoxy. Metal layers 108 are formed on the top and bottom of dielectric core 106. Metal layers 108 can be formed out of one of a variety of electrically conductive materials known to those skilled in the relevant arts, e.g., copper, aluminum, gold, or silver. Although not shown in FIG. 1, metal layers 108 can be a patterned so that they can be used to conduct signals to and from an IC die.

Top and bottom layers 104a and 104b each include metal layers 112 and 118 separated by dielectric layers 110. Dielectric layers 110 can be formed out of materials similar to dielectric core 106 and metal layers 112 and 118 can be formed out of similar materials as those used to form metal layers 108. As shown in FIG. 1, each of metal layers 112 and 118 can be patterned. Like patterns for metal layers 108, patterns of layers 112 and 118 can be used to communicate signals to and from an IC die attached to substrate 100 (not shown in FIG. 1). As shown in FIG. 1, substrate 100 has a 2+2+2 configuration. That is, substrate has two metal layers directly on dielectric core 106, namely metal layers 108, and two metal layers on each of those two metal layers, namely metal layers 112 and 118. As would be appreciated by those skilled in the relevant art based on the description herein, substrate 100 can have other configurations. For example, substrate 100 can have a 3+2+3 configuration (with three metal layers formed on each of the metal layers directly on the dielectric core) or a 4+2+4 configuration (with four metal layers formed on each of the metal layers directly on the dielectric core).

Vias 114 are used to communicate signals between different layers of substrate 100. Vias 114 can be filled or lined with conductive materials (e.g., copper) to facilitate electrical connections between different layers. As would be appreciated by those skilled in the relevant art, the degradation of a signal when passing from one metal layer to another through a dielectric layer depends on the thickness of the dielectric layer and the size of the via used to pass the signal. Because dielectric layers 110 are relatively thin, vias 114 can be relatively small and still effectively pass signals between metal layers 112 and 118. Core dielectric 106, on the other hand, is relatively thick. Thus, a relatively large via 116 is used to pass signals between metal layers 108. Even with this larger via, however, degradation of a signal passing through via 116 may be too large for certain signals. For example, when substrate 100 is used in a package on package (PoP) devices or stacked die devices in which one IC die communicates signals with another IC using substrate 100, metal layers 112 of bottom layers 104*b* may not be used because of the signal degradation that occurs when signals pass through core dielectric 106. The signals between IC dies in the same device can be weaker than signals communicated between an IC die and a printed circuit board and therefore more susceptible to degradation caused by passing through core layer 106. Thus, in PoP and stacked die packages, half of metal layers 112 are often effectively wasted in the final IC device.

In embodiments described herein, methods and systems are provided in which a pair of substrates is formed using a manufacturing process typically used for a single substrate. In one embodiment, instead of wasting half of the metal layers of a substrate, those metal layers are put to use in a second substrate, thereby increasing the number of substrates formed in a given manufacturing process and decreasing or eliminating waste with regard to portions of a substrate.

FIG. 2 shows a flowchart 200 providing example steps for manufacturing an IC device, according to an embodiment of the present invention. Other structural and operational embodiments will be apparent to persons skilled in the relevant art(s) based on the following discussion. The steps shown in FIG. 2 do not necessarily have to occur in the order shown. The steps of FIG. 2 are described in detail below.

In step 202, first and second intermediate substrates are formed. In an embodiment, forming the first and second intermediate substrates can include forming vias through the dielectric cores, plating core dielectrics with metal layers, and patterning the metal layers. The first and second intermediate substrates can have the same design or different designs. For example, the metal layers of the first and second intermediate substrates can have the same patterns or different patterns.

Figure 3:
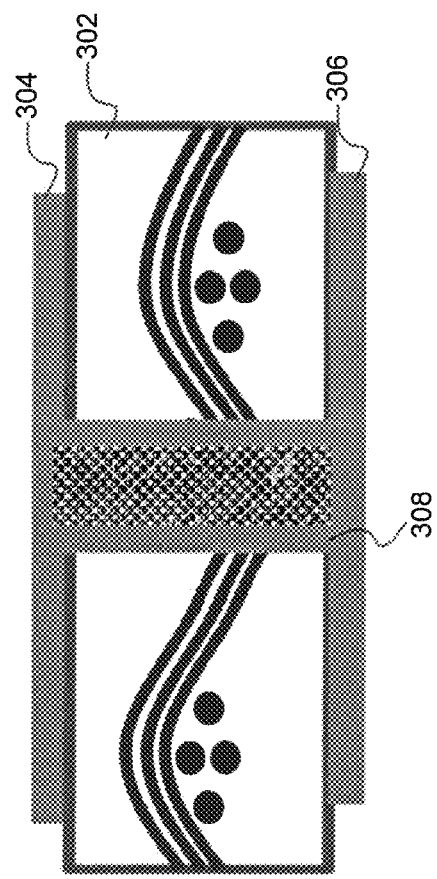
FIG. 3 shows a cross-sectional diagram of an intermediate substrate, according to an embodiment of the present invention.

For example, FIG. 3 shows a cross-sectional diagram of an intermediate substrate 300, according to an embodiment of the present invention. Intermediate substrate 300 includes a core dielectric 302, a first metal layer 304, a second metal layer 306, and a via 308. Core dielectric 302 can be substantially similar to core dielectric 106, described with reference to FIG. 1. In an embodiment, via 308 is formed by drilling a hole through core dielectric and filling or lining with an electrically conductive material, such as copper. Metal layers 304 and 306 can be patterned using, for example, etching techniques known to those skilled in the relevant art. In a further embodiment, at least one of metal layers 304 and 306 can be used as a ground plane.

Figure 4:
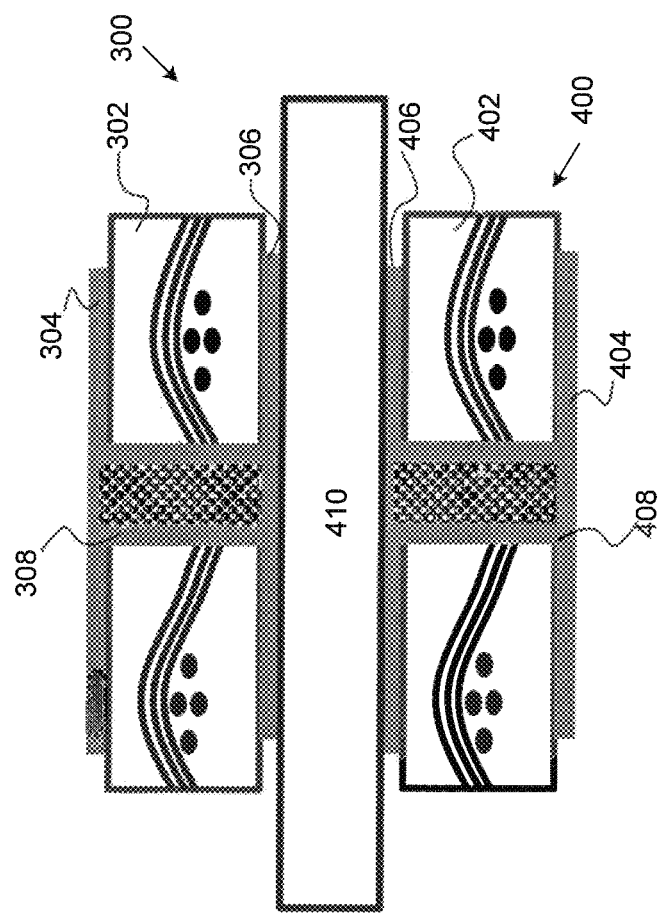
FIG. 4 shows a cross-sectional diagram of a first intermediate substrate coupled to a second intermediate substrate using a manufacturing carrier, according to an embodiment of the present invention.

In step 204, a first surface of the first intermediate substrate is coupled to a first surface of the second intermediate substrate. For example, the respective first surfaces of the first and second intermediate substrates can be coupled to opposite sides of a manufacturing carrier. For example, FIG. 4 shows a cross-sectional diagram of first intermediate substrate 300 coupled to a second intermediate substrate 400, according to an embodiment of the present invention. Second intermediate substrate 400 includes a core dielectric 402, first and second metal layers 404 and 406, and a via 408. In an embodiment, core dielectric 402, first and second metal layers 404 and 406, and via 408 can be substantially similar to core dielectric 302, first and second metal layers 304 and 306, and via 308, respectively. In an embodiment, the bottom surface of metal layer 306 can be a first surface of first intermediate substrate 300 and the top surface of metal layer 406 can be a first surface of second intermediate substrate 400. As shown in FIG. 4, metal layers 306 and 406 of first and second intermediate substrates 300 and 400, respectively, are coupled to opposite sides of a manufacturing carrier 410. Manufacturing carrier 410 can be formed out one of a variety materials used in IC device manufacturing. For example, manufacturing carrier 410 can be formed out of a metal (e.g., copper or stainless steel), a ceramic, a glass fiber material like paper, or a printed circuit board, silicon, a glass, a pre-peg material or a plastic. Metal layers 306 and 406 can be coupled to manufacturing carrier 410 through the use of an adhesive (not shown in FIG. 4). In an embodiment, the adhesive is capable of maintaining adhesion despite the stresses imposed by the manufacturing process (e.g., thermally imposed stresses).

In step 206, a plurality of patterned metal layers are formed on a second surface of the first intermediate substrate and on a second surface on the second intermediate substrate to form first and second substrates, respectively.

Figure 5:
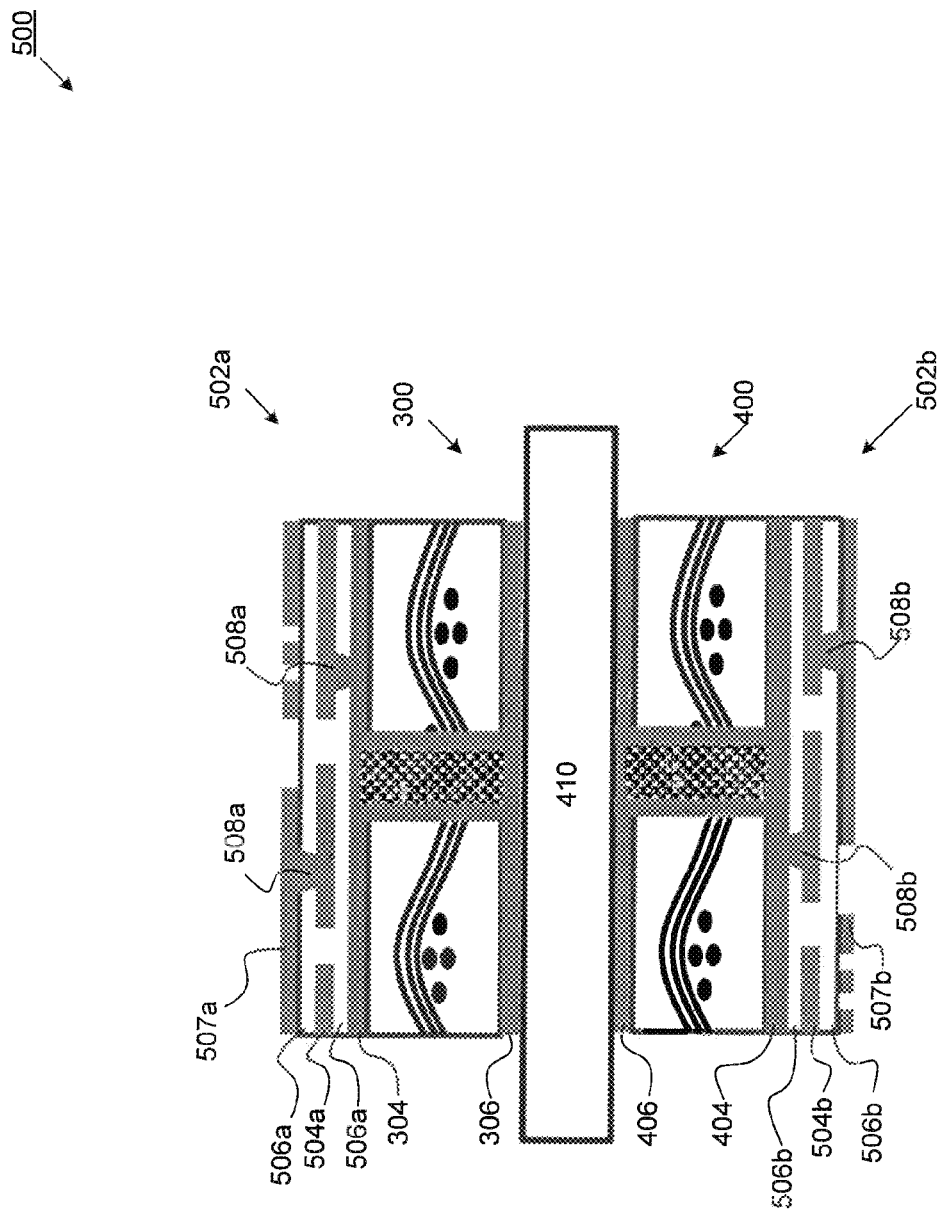
FIG. 5 shows a cross-sectional diagram of a substrate production module, according to an embodiment of the present invention.

For example, FIG. 5 shows a cross-sectional diagram of a substrate production module 500 including a first substrate 502*a* and a second substrate 502*b*, according to an embodiment of the present invention. As shown in FIG. 5, first substrate 502*a* includes patterned metal layers 504*a* and 507*a* and dielectric layers 506*a* formed on first intermediate substrate 300 and second substrate 502*b* includes patterned metal layers 504*b* and 507*b* and dielectric layers 506*b* formed on second intermediate substrate 400. Moreover, first and second substrates 502*a* and 502*b* also include vias 508*a* and 508*b*, respectively.

In an embodiment, metal layers 504*a*, 504*b*, 507*a*, and 507*b* can be patterned, e.g., using etching techniques known to those skilled in the art. As shown in FIG. 5, the patterns of metal layers 504*a* and 507*a* are substantially the same as the patterns of metal layers 504*b* and 507*b*, respectively. In alternate embodiments, the patterns of metal layers 504*a* and 507*a* can be different from the patterns of metal layers 504*b* and 507*b*, respectively. As shown in FIG. 5, first and second substrates 502*a* and 502*b* both have 2+2+2 configurations. However, as would be appreciated by those skilled in the relevant arts based on the description herein, first and second substrates 502*a* and 502*b* can have other configurations (e.g., 3+2+3 or 4+2+4 configurations) without departing from the scope and spirit of the present invention (e.g., by forming additional patterned metal layers in step 206).

Figure 6:
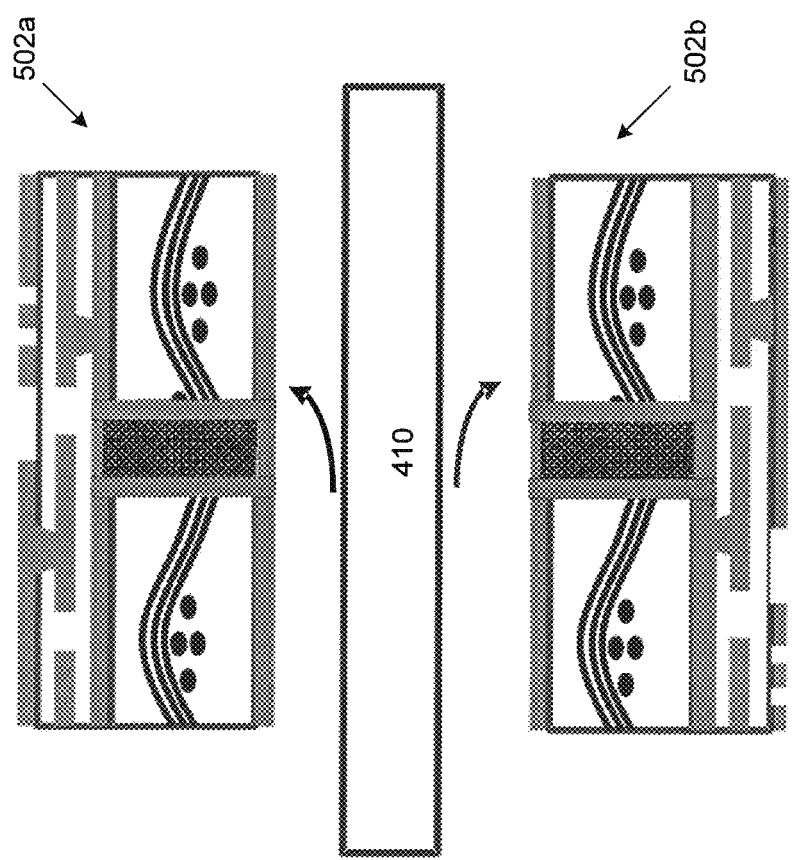
FIG. 6 shows a cross-sectional diagram of first and second substrates separated from a manufacturing carrier, according to an embodiment of the present invention.

In step 208, the first and second substrates are separated. For example, FIG. 6 shows a cross-sectional diagram of first and second substrates 502A and 502B separated from manufacturing carrier 410, according to an embodiment of the present invention. In an embodiment, substrates 502*a* and 502*b* can be separated from manufacturing carrier 410 in a variety of different ways. For example, substrates 502*a* and 502*b* can be separated from manufacturing carrier 410 through the use of mechanical force. In another embodiment, heat may be used to weaken an adhesive that couples substrate 502*a* and 502*b* to manufacturing carrier 410 (e.g., to separate substrates 502*a* and 502*b* from manufacturing carrier 410 or to facilitate mechanical separation of substrates 502*a* and 502*b* from manufacturing carrier 410). In a further embodiment, mechanical forces can be used after the adhesive has been weakened. In an embodiment in which the adhesive is sensitive to ultraviolet (UV) radiation, UV radiation can be used instead of or in addition to thermal methods to weaken the adhesive. In still another embodiment, an ultrasound can be applied to substrate production module 500 to weaken the adhesive. In yet another embodiment, a laser can be used to cut each of substrates 502a and 502b free of manufacturing carrier 410.

Figure 7:
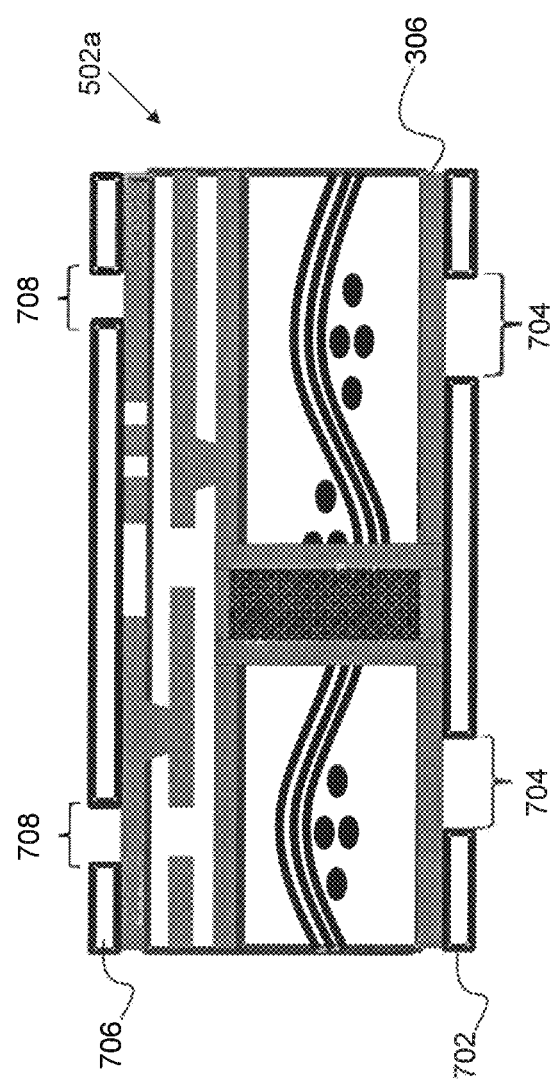
FIG. 7 shows a cross-sectional diagram of a substrate having a solder mask, according to an embodiment of the present invention.

In step 210, a solder mask is formed on the first surface of the first substrate and on the first surface of the second substrate. For example, FIG. 7 shows a cross-sectional diagram of first substrate 502a, according to an embodiment of the present invention. First substrate 502a has a solder mask 702 formed on metal layer 306. As shown in FIG. 7, solder mask 702 exposes certain portions 704 of metal layer 306. In an embodiment, the exposed portions are configured to be coupled to solder balls or other interconnection elements (e.g., pins) that are used to couple an IC device to a PCB.

In an embodiment, a solder mask can also be formed on the second surface of the first substrate. For example, in FIG. 7, solder mask 706 is formed on metal layer 507a of first substrate 502a. Solder mask 706 exposes portions 708 of metal layer 507a. However, unlike exposed portions 704, which are configured to be coupled to solder balls or other connection elements, exposed portions 708 can be used facilitate interconnection with an IC die. For example, exposed portions 708 can be configured to be coupled to wire bonds or solder bumps to allow for an IC die to be electrically coupled to first substrate 502a. In another embodiment, a solder mask can be formed on the first surface and/or the second surface of the second substrate.

Figure 8:
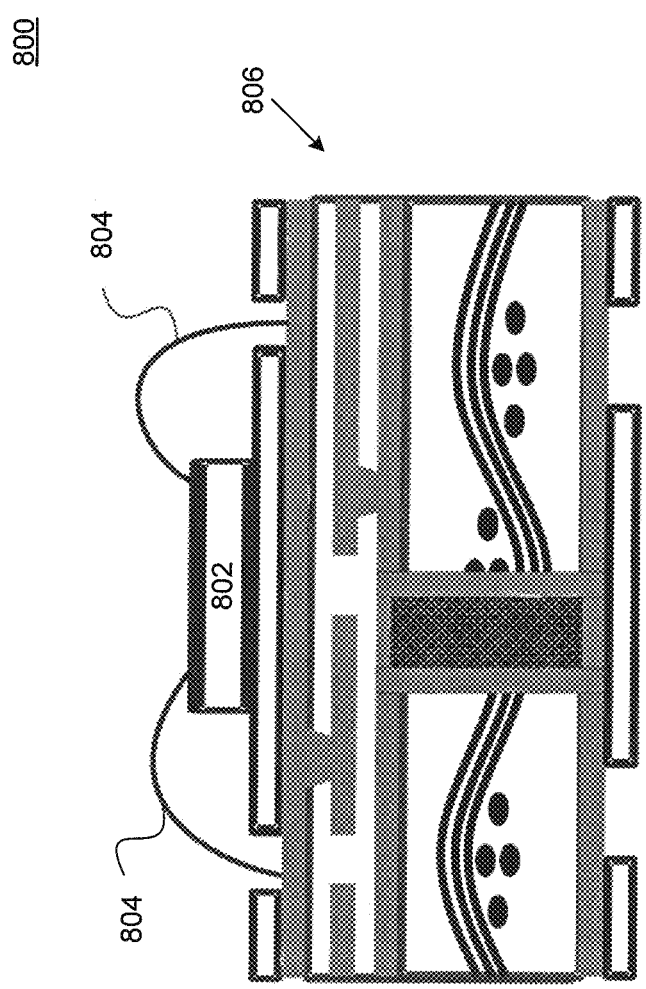
FIG. 8 shows a cross-sectional diagram of an IC device, according to an embodiment of the present invention.

In step 212, an IC die is coupled to the first substrate. In step 214, another IC die is coupled to the second substrate. In the embodiment in which the patterns of the metal layers of the first and second substrates is the same, the IC dies coupled to the first and second substrates can have the same design. Alternatively, if the patters of the metal layers of the first and second substrates are different, the IC dies coupled to the first and second substrates can have different designs. For example, FIG. 8 shows a cross-sectional diagram of an IC device 800, according to an embodiment of the present invention. IC device 800 includes an IC die 802 coupled to a substrate 806 in a die up configuration. As shown in FIG. 8, IC die 802 is electrically coupled to substrate 806 through wire bonds 804. As would be appreciated by those skilled in the relevant art, IC die 802 can instead be coupled to substrate 806 through solder bumps in a die down configuration. In an embodiment, substrate 806 can be either of first substrate 502a or second substrate 502b, formed using the steps of flowchart 200.

CONCLUSION

The embodiments of the invention have been described above with the aid of functional building blocks illustrating the implementation of specified functions and relationships thereof The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method of manufacturing integrated circuit (IC) devices, comprising:
   coupling a first surface of a first intermediate substrate to a first surface of a manufacturing carrier;
   coupling a first surface of a second intermediate substrate to a second surface of the manufacturing carrier, wherein the second surface of the manufacturing carrier is on the opposite side of the manufacturing carrier as that of the first surface of the manufacturing carrier;
   forming a first plurality of patterned metal layers on a second surface of the first intermediate substrate to form a first substrate and a second plurality of patterned metal layers on a second surface of the second intermediate substrate to form a second substrate; and
   separating the first and second substrates from the manufacturing carrier, wherein each of the first substrate and the second substrate is configured to facilitate electrical interconnection between a respective IC die and a respective printed circuit board (PCB).

2. The method of claim 1, wherein patterns of the first plurality of patterned metal layers are substantially the same as patterns of the second plurality of patterned metal layers.

3. The method of claim 1, wherein patterns of the first plurality of patterned metal layers are different from patterns of the second plurality of patterned metal layers.

4. The method of claim 1, further comprising:
   coupling an IC die to the second surface of the first intermediate substrate.

5. The method of claim 1, wherein at least one of the first substrate or the second substrate is configured to facilitate electrical, interconnection between two IC dies located in the same IC device.

6. The method of claim 1, wherein coupling the first surface of the first intermediate substrate to the first surface of the manufacturing carrier comprises:
   coupling the first surface of the first intermediate substrate to the first surface of the manufacturing carrier using an adhesive.

7. The method of claim 6, wherein coupling the second surface of the second intermediate substrate to the second surface of the manufacturing carrier comprises:
   coupling the first surface of the second intermediate substrate to the second surface of the manufacturing carrier with an adhesive.

8. The method of claim 1, wherein the manufacturing carrier comprises at least one of a metal, a glass, or laminate.

9. The method of claim 1, further comprising:
   forming the first intermediate substrate.

10. The method of claim 9, further comprising:
    forming a first metal layer on a first surface of a dielectric material; and
    forming a second metal layer on a second surface of the dielectric material;

wherein the first surface of the intermediate substrate comprises a surface of the first metal layer and the second surface of the intermediate substrate comprises a surface of the second metal layer.

11. The method of claim 10, further comprising:
forming a solder mask on the first metal layer, wherein the solder mask exposes portions of the first metal layer.

12. The method of claim 11, wherein the exposed portion of the first metal layer is configured to be attached to a solder ball.

13. The method of claim 9, wherein forming the first intermediate substrate comprises:
forming a via through a dielectric material.

14. The method of claim 1, wherein at least one of the first plurality of metal layers comprises a ground plane.

15. The method of claim 1, wherein the coupling comprises coupling the respective first surfaces of the first and second intermediate substrates to opposite sides of the manufacturing carrier.

16. A substrate production module, comprising:
a manufacturing carrier having opposing first and second surfaces;
a first substrate coupled to the first surface of the manufacturing carrier; and
a second substrate coupled to the second surface of the manufacturing carrier;
wherein each of the first and second substrates comprises a plurality of metal layers separated by one or more dielectric layers, wherein each of the plurality of metal layers includes a first metal layer configured to be electrically coupled to a respective IC die and a second metal layer configured to be electrically coupled to a respective printed circuit board (PCB), and wherein the first and second substrates are electrically isolated.

17. The substrate production module of claim 16, wherein the first substrate comprises a dielectric core.

18. The substrate production module of claim 17, wherein the dielectric core has first and second opposing surfaces and wherein the second metal layer of the plurality of metal layers of the first substrate is attached to the first surface of the manufacturing carrier and is attached to the first surface of the dielectric core.

19. The substrate production module of claim 16, wherein the manufacturing carrier comprises at least one of a metal, a ceramic, a glass fiber material, silicon, a pre-peg material, or a plastic.

20. The substrate production module of claim 16, wherein each of the plurality of metal layers of the first substrate is patterned substantially the same as a respective one of the plurality of metal layers of the second substrate.

* * * * *